United States Patent
Wong

(10) Patent No.: US 11,929,264 B2
(45) Date of Patent: Mar. 12, 2024

(54) DRYING SYSTEM WITH INTEGRATED SUBSTRATE ALIGNMENT STAGE

(71) Applicant: Applied Materials, Inc., Santa Clara, CA (US)

(72) Inventor: Justin Ho Kuen Wong, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/681,670

(22) Filed: Feb. 25, 2022

(65) Prior Publication Data

US 2022/0285175 A1    Sep. 8, 2022

Related U.S. Application Data

(60) Provisional application No. 63/156,298, filed on Mar. 3, 2021.

(51) Int. Cl.
| | |
|---|---|
| H01L 21/02 | (2006.01) |
| B08B 3/10 | (2006.01) |
| F26B 3/04 | (2006.01) |
| F26B 11/18 | (2006.01) |
| F26B 25/00 | (2006.01) |
| H01L 21/67 | (2006.01) |

(Continued)

(52) U.S. Cl.
CPC .......... *H01L 21/67057* (2013.01); *B08B 3/10* (2013.01); *F26B 3/04* (2013.01); *F26B 11/18* (2013.01); *F26B 25/003* (2013.01); *H01L 21/67259* (2013.01); *H01L 21/68* (2013.01); *H01L 21/68707* (2013.01)

(58) Field of Classification Search
CPC ............ H01L 21/00–86; H01L 21/677–67796
See application file for complete search history.

(56) References Cited

U.S. PATENT DOCUMENTS

| | | |
|---|---|---|
| 6,413,145 B1 | 7/2002 | Pinson et al. |
| 6,500,051 B1 | 12/2002 | Nishi et al. |

(Continued)

FOREIGN PATENT DOCUMENTS

| | | |
|---|---|---|
| KR | 10-2009-0037529 | 4/2009 |
| WO | WO 2005/006409 | 1/2005 |
| WO | WO 2020/078190 | 4/2020 |

OTHER PUBLICATIONS

International Search Report and Written Opinion in International Appln. No. PCT/US2022/017892, dated Jun. 10, 2022, 10 pages.

*Primary Examiner* — Mikhail Kornakov
*Assistant Examiner* — Richard Z. Zhang
(74) *Attorney, Agent, or Firm* — Fish & Richardson P.C.

(57) ABSTRACT

A substrate cleaning and drying system includes a cleaning station, a drying station positioned adjacent the cleaning station, a cleaner robot to transfer a substrate from the cleaning station to the drying station, an aligner stage adjacent to the drying station, a robot arm rotatable between a substantially vertical first position for receiving the substrate from the drying station and a substantially horizontal second position for releasing the substrate onto the aligner stage, and a factory interface robot to transfer a substrate from the aligner stage into a factory interface module while in a horizontal orientation. The aligner stage includes a rotatable support to hold the substrate in a substantially horizontal orientation and to rotate the substrate to a desired orientation.

12 Claims, 5 Drawing Sheets

(51) Int. Cl.
*H01L 21/68* (2006.01)
*H01L 21/687* (2006.01)

(56) References Cited

U.S. PATENT DOCUMENTS

| | | | |
|---|---|---|---|
| 6,726,848 B2* | 4/2004 | Hansen | B08B 3/048 |
| | | | 216/99 |
| 6,818,066 B2 | 11/2004 | Cheung | |
| 2002/0121290 A1 | 9/2002 | Tang et al. | |
| 2006/0219275 A1 | 10/2006 | Martin et al. | |
| 2006/0254715 A1* | 11/2006 | Yudoovsky | H01L 21/67173 |
| | | | 156/345.32 |
| 2006/0260653 A1 | 11/2006 | Fishkin et al. | |
| 2007/0111519 A1* | 5/2007 | Lubomirsky | H01L 21/02068 |
| | | | 257/E21.174 |
| 2007/0272278 A1 | 11/2007 | Fishkin et al. | |
| 2008/0093022 A1 | 4/2008 | Yilmaz et al. | |
| 2008/0166208 A1* | 7/2008 | Lester | H01L 21/68707 |
| | | | 414/217 |
| 2009/0044843 A1 | 2/2009 | Shirazi | |
| 2010/0041316 A1 | 2/2010 | Wang et al. | |
| 2010/0171823 A1 | 7/2010 | Yamamoto et al. | |
| 2010/0320090 A1* | 12/2010 | Yoshioka | C25D 7/123 |
| | | | 205/157 |
| 2012/0305033 A1 | 12/2012 | Keigler et al. | |
| 2013/0130593 A1 | 5/2013 | Kalenian et al. | |
| 2014/0202921 A1* | 7/2014 | Babbs | H01L 21/67201 |
| | | | 206/710 |
| 2014/0209239 A1 | 7/2014 | Ko et al. | |
| 2014/0271085 A1* | 9/2014 | Gajendra | H01L 21/681 |
| | | | 414/757 |
| 2016/0181086 A1 | 6/2016 | Mikhaylichenko et al. | |
| 2017/0236739 A1 | 8/2017 | Moura et al. | |
| 2017/0320188 A1 | 11/2017 | Kweon et al. | |
| 2019/0304826 A1* | 10/2019 | Liu | G01N 21/9503 |
| 2020/0176279 A1 | 6/2020 | Velazquez et al. | |
| 2021/0398834 A1 | 12/2021 | Shen et al. | |
| 2022/0282918 A1 | 9/2022 | Wong | |

* cited by examiner

DRYING SYSTEM WITH INTEGRATED SUBSTRATE ALIGNMENT STAGE

CROSS-REFERENCE TO RELATED APPLICATIONS

This application claims the benefit of priority to U.S. Provisional Application No. 63/156,298, filed on Mar. 3, 2021, the contents of which are hereby incorporated by reference.

TECHNICAL FIELD

This disclosure relates to methods and systems for drying and aligning substrates.

BACKGROUND

An integrated circuit is typically formed on a substrate (e.g., a semiconductor wafer) by the sequential deposition of conductive, semiconductive, or insulative layers, and by the subsequent processing of the layers.

Chemical mechanical polishing (CMP) is a process for planarization of substrate surfaces used in integrated circuit fabrication. Generally, CMP is performed by providing relative motion between a substrate pressed against a polishing surface.

Following polishing, a substrate has to be cleaned and dried to effectively remove contaminants from the substrate's surface. These contaminants may include abrasive particles from the polishing slurry, material removed from the substrate due to polishing, particles abraded from the polishing pad, or other particulate or chemical contamination. Desirable cleaning levels can be achieved by using one or more of aqueous cleaning in a tank of cleaning fluid, a buffing brush, a buffing pad, or a rinsing bath. Drying of a wet substrate can be performed using spin-dry or by Marangoni drying. Following post-CMP cleaning and drying, the substrate is offloaded by a factory interface robot. Measurements of the substrate, e.g., to detect thickness variations across the substrate, can be performed by an in-line system in the factory interface module or with a stand-alone metrology system after offloading of the substrate from the cleaner.

SUMMARY

In one aspect, a substrate cleaning and drying system includes a cleaning station including a first support to hold a substrate in a substantially vertical orientation, a drying station positioned adjacent the cleaning station, a cleaner robot to transfer a substrate from the cleaning station to the drying station, an aligner stage adjacent to the drying station, a robot arm rotatable between a substantially vertical first position for receiving the substrate from the drying station and a substantially horizontal second position for releasing the substrate onto the aligner stage, a factory interface module to support a cassette to hold a plurality of substrates, and a factory interface robot to transfer a substrate from the aligner stage into the factory interface module while in a horizontal orientation. The drying station includes a tank to contain a liquid, a second support to hold the substrate in a generally vertical orientation in the liquid, and a dispenser to deliver drying fluid comprising a surfactant. The aligner stage includes a rotatable support to hold the substrate in a substantially horizontal orientation and to rotate the substrate about an axis substantially perpendicular to the substrate to a desired orientation.

In another aspect, a substrate drying system for use in a CMP cleaner include a drying station having a drier, an aligner stage adjacent to the drying station, and a robot arm movable between a first position above the drier and a second position for releasing substrates onto the rotatable support of the aligner stage with the substrate in a generally horizontal orientation. The aligner stage includes a rotatable support to hold a substrate in a substantially horizontal position and to rotate the substrate to a desired orientation.

In another aspect, a method of operating a drying system includes drying a first wafer with a vertical drying process, tilting the dried first wafer to a horizontal orientation, and aligning the first wafer about a vertical axis while simultaneously drying a second wafer with the vertical drying process.

Certain implementations may include, but are not limited to, one or more of the following possible advantages. The drying and aligning of substrates can be performed more efficiently, improving throughput. Reducing the total number of robot moves required to dry and align the substrate allows the robot to maintain its steady state cycle and streamlines the process. The reduction in average processing time can lower the cost per substrate. The substrates can be aligned and inserted into an in-line metrology system or into a substrate cassette in a desired orientation.

The details of one or more implementations are set forth in the accompanying drawings and the description. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Following chemical mechanical polishing, a substrate needs to be cleaned and dried in order to remove debris and contaminants. Following this process, the substrate is picked up by the factory interface robot. The factory interface robot then places the substrate into an in-line metrology station or into a substrate cassette. However, the substrate must typically be in a predetermined orientation, i.e., "aligned," when inserted into the in-line metrology station or substrate cassette. Although the factory interface robot typically has sufficient degrees of freedom to rotate the substrate for the required alignment, these steps take time during which the factory interface robot is unable to perform other functions, e.g., transporting another substrate from a cassette to the polishing system. As such, time required by the factory interface robot to align the substrate can decrease throughput and increase processing time.

An approach that may address one or more of these issues is to incorporate an alignment system as part of the post- CMP drying process, and to interface the alignment system with the factory interface robot.

Figure 1:
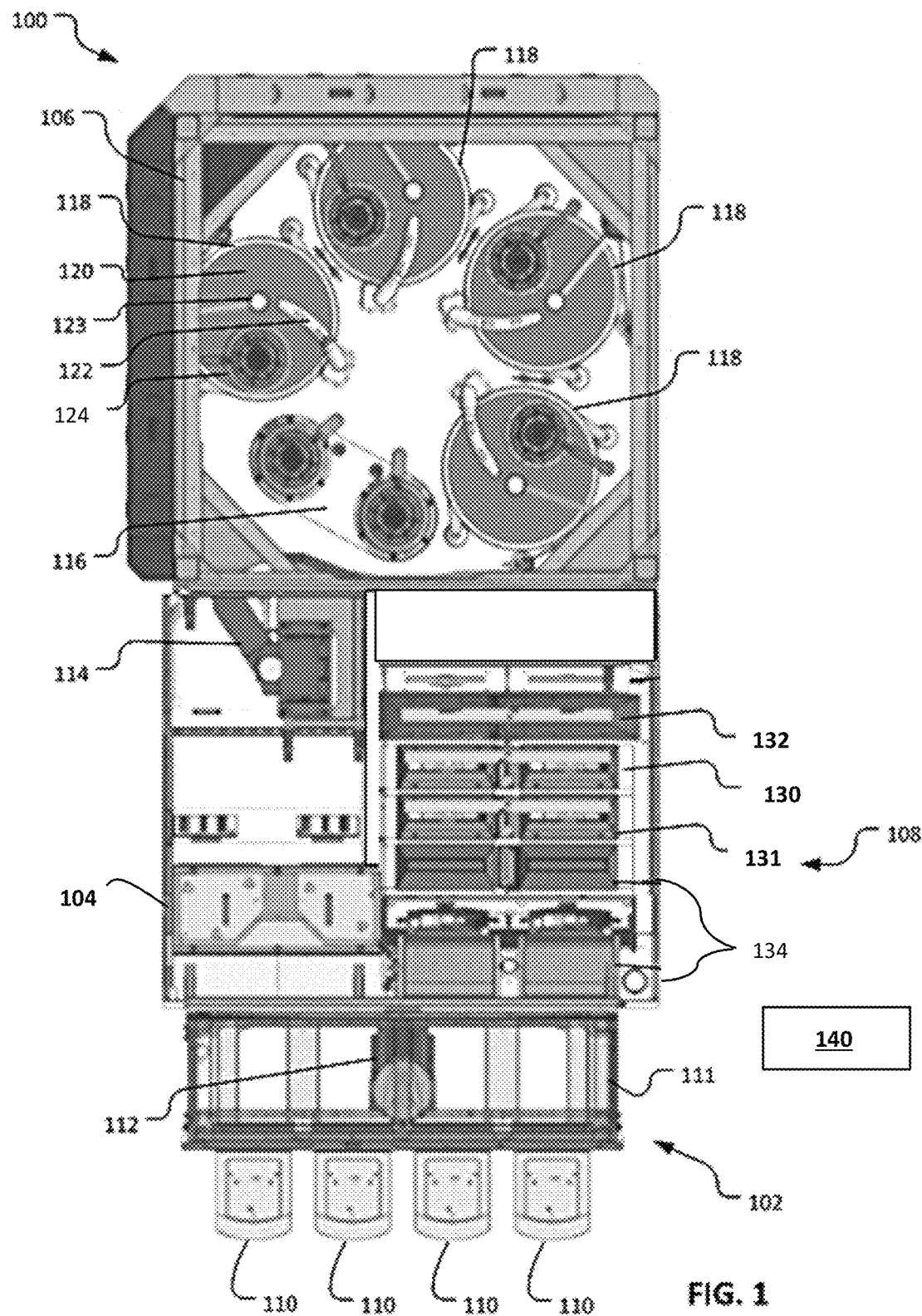
FIG. 1 is a schematic top view of a chemical mechanical polishing system

FIG. 1 illustrates an interior view of a chemical mechanical polishing (CMP) system 100. The system 100 generally includes a factory interface 102, an input pass through station 104, a polisher 106, and a cleaner 108 that has a drying station 134 with a drier e.g., a Marangoni drier, to dry substrates that have been cleaned. The four major components are generally disposed within the CMP system 100.

The factory interface 102 includes a support to hold a plurality of substrate cassettes 110, a housing 111 that encloses a chamber, and one or more factory interface robots 112. The factory interface robot 112 generally provides the range of motion required to transfer substrates between the cassettes 110 and other modules of the system 100, e.g., from the cassettes 110 to the input station 104 and from the drying station 134 of the cleaner 108 back to the cassettes 110.

Unprocessed substrates are generally transferred from the cassettes 110 to the input station 104 by the factory interface robot 112. The input station 104 generally facilitates transfer of the substrate between the factory interface robot 112 and the transfer robot 114. The transfer robot 114 transfers the substrate between the input station 104 and the polisher 106.

The polisher 106 generally includes a transfer station 116 and one or more polishing stations 118. The transfer station 116 is configured to receive the substrate from the transfer robot 114, and to transfer the substrate to a carrier head 124 that retains the substrate during polishing. Following a polishing operation performed on a substrate, the carrier head 124 will transfer the substrate back to the transfer station 116.

Each polishing station 118 includes a rotatable disk-shaped platen on which a polishing pad 120 is situated. The platen is operable to rotate about an axis. The polishing pad 120 can be a two-layer polishing pad with an outer polishing layer and a softer backing layer. The polishing stations 118 further includes a dispensing arm 122, to dispense a polishing liquid, e.g., an abrasive slurry, onto the polishing pad 120. In the abrasive slurry, the abrasive particles can be silicon oxide, but for some polishing processes use cerium oxide abrasive particles. The polishing station 118 can also include a conditioner head 123 to maintain the polishing pad 120 at a consistent surface roughness.

The transfer robot 114 then removes the substrate from the polisher 106. In some implementations, the transfer robot 114 removes the substrate in a horizontal orientation from the polisher 106 and reorients the substrate vertically to be placed in the cleaner 108.

The cleaner 108 generally includes one or more cleaning stations that can operate independently or in concert. For example, the cleaner 108 can include one or more brush or buffing pad cleaners 130, 131 and a megasonic cleaner 132. Briefly, a pad cleaner 130 includes a chamber in which a substrate can be placed and rotating brushes or spinning buffing pads contact the surface of the substrate to remove any remaining particulates. In the megasonic cleaner 132 high frequency vibrations produce controlled cavitation in a cleaning liquid to clean the substrate. After cleaning, the substrates are transferred into the drier in the drying station 134. The drying station 134 can also serve as a rinsing and drying station, e.g., to rinse the substrate in a rinsing liquid and then dry the substrate as the substrate is being removed from the rinsing liquid.

In some implementations, at least two of the cleaning stations are configured to hold the substrate in a substantially vertical orientation, e.g., up to 15° off vertical axis, during the cleaning process. The substrate can be transferred in the substantially vertical orientation between the cleaning stations and the drying station by a cleaner robot arm suspended from and movable along a track. A controller 140 can cause the robot arm to hold and walk each substrate from one station to the next along the track. The drying station 134 can be positioned adjacent to the cleaner 108 at the end of the track.

Figure 2:
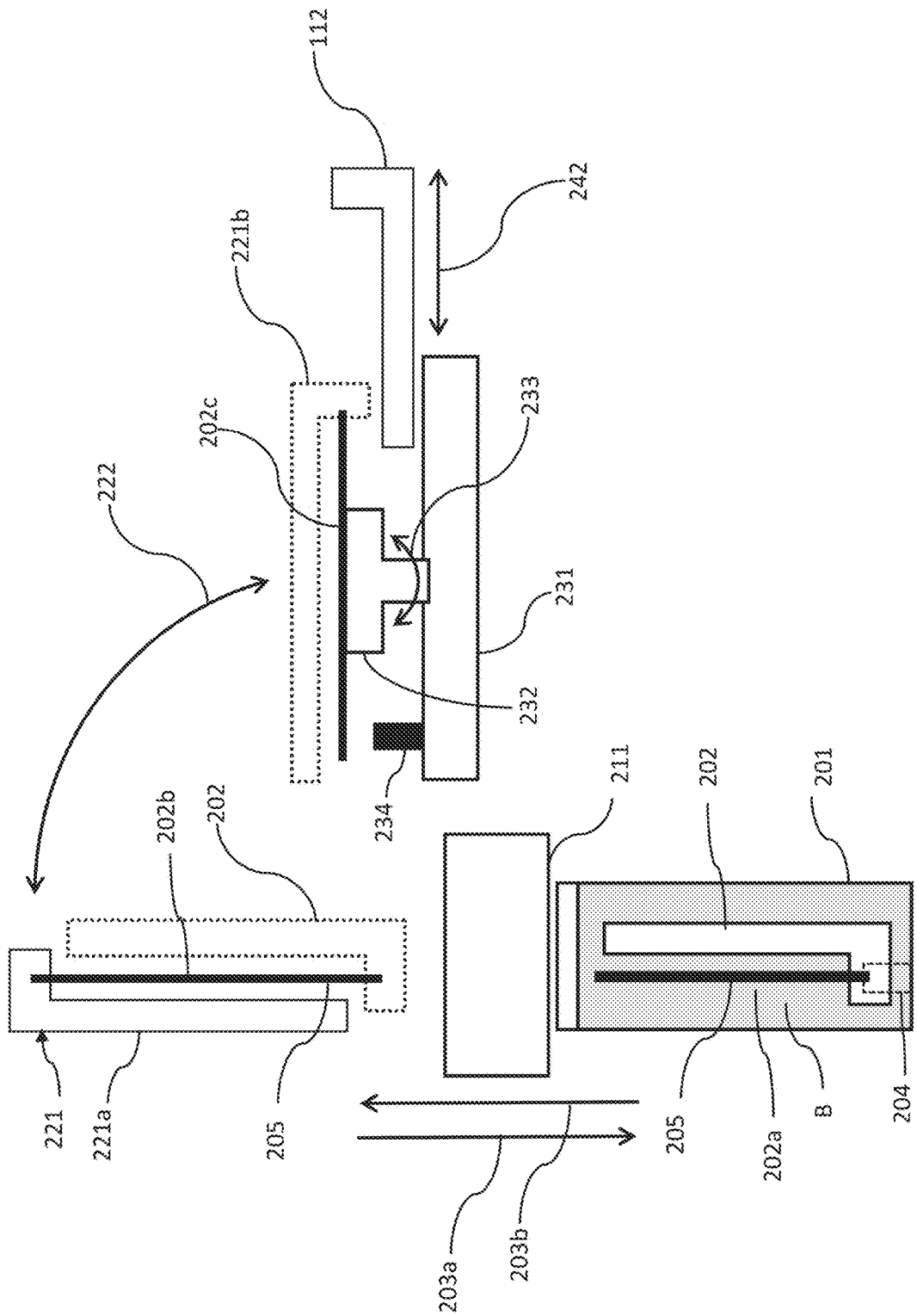
FIG. 2 is a schematic side view of a drying system that includes a drying station and a substrate alignment stage.
Figure 3:
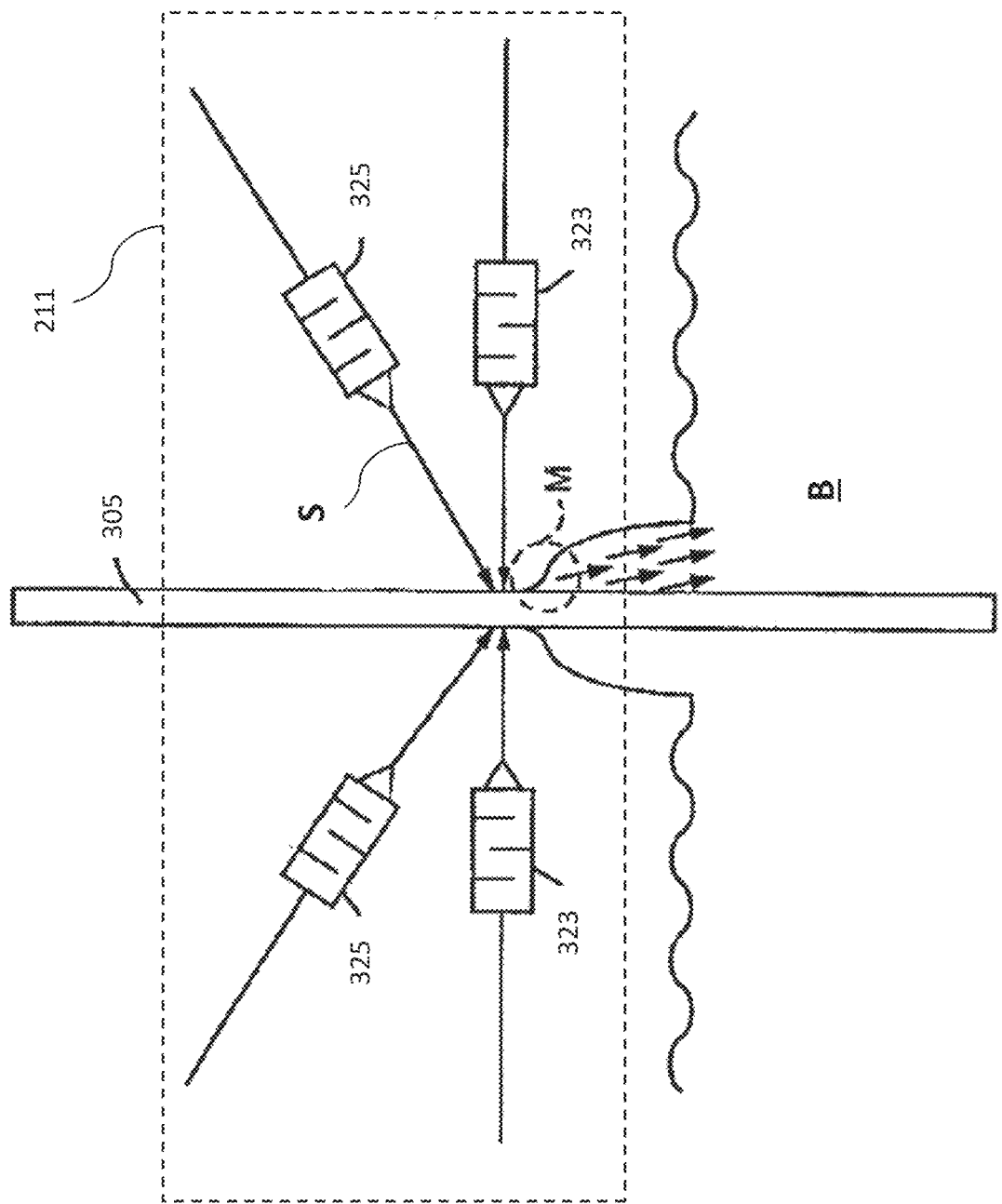
FIG. 3 is a schematic close-up view of a substrate and nozzles positioned within a drier

As shown in FIG. 2, the drying station 134 includes a tank 201 of liquid (B), e.g, rinsing liquid, and a support 204 that holds a substrate 205 in a substantially vertical orientation, e.g., up to 15° off vertical axis. Either as part of the tank 201 or supported above the tank 201 is a drier 211, e.g., a Marangoni drier. FIG. 3 schematically illustrates the operation of the drier 211 in more detail. In a Marangoni drier a solvent (S) e.g., liquid or vaporous isopropyl alcohol (IPA), that is miscible with the liquid (B) is introduced to a fluid meniscus (M) which forms as the substrate is lifted from the bath or as the bath fluid is drained past the substrate. The solvent is absorbed along the surface of the liquid, with the concentration of the solvent being higher at the tip of the meniscus. The higher concentration of solvent causes surface tension to be lower at the tip of the meniscus than in the bulk of the bath liquid, causing bath liquid to flow from the drying meniscus toward the bulk bath liquid. Such a flow is known as a "Marangoni" flow, and can be employed to achieve substrate drying without leaving streaks, spotting or bath residue on the substrate.

As one example, within the drier 211, a drying vapor supply that has one or more drying vapor nozzles 325 is positioned to flow drying vapor across the entire horizontal diameter of the substrate 305 as the substrate 305 is lifted from the tank 201. The drying vapor can be the solvent, e.g., isopropyl alcohol. The drying vapor nozzles 325 preferably are positioned so that the drying vapor will be absorbed by the rinsing liquid at an air/substrate/rinsing liquid interface, and the interface preferably forms a meniscus (as enclosed by the dashed circle "M" in FIG. 3). Alternatively, the solvent can be supplied in liquid form into the tank 201 to form a liquid film on top of the bath fluid (B). In addition, an optional rinsing liquid supply that has one or more rinsing fluid nozzles 323 can be positioned to spray rinsing liquid across the entire horizontal diameter of the substrate 305 as the substrate 305 is lifted from the tank 201 into the drier 211.

Returning to FIG. 2, substrate 205 is lowered into the tank 201, as shown by arrow 203a. The substrate 205 is held in the tank 201 by the support 204 at a first position 202a. The substrate 205 can be lowered directly into the tank 201 by the cleaner robot arm so that the substrate 205 is transferred to the support 204 in the tank. Alternatively, the substrate 205 can be placed on the support 204 by the cleaner robot arm while the support 204 is above the tank 201, and the support 204 with the substrate 205 can then be lowered into the tank 201. As still another alternative, the substrate 205 could be handed off above the tank 201 from the cleaner robot arm to a dedicated robot that lowers the substrate onto the support 204 in the tank.

The substrate 205 is raised substantially vertically by a first robot arm 202 from the first position 202a in the tank 201 to a second position 202b, as shown by the arrow 203b. The first robot arm 202 can lift the substrate 205 along an axis that is up to 15° off vertical. In the second position 202b, the substrate 205 can be entire removed from the tank 201 (as illustrated in FIG. 2), or the substrate 205 can be only partially out of the tank 201, e.g., about half out of the tank 201. In some implementations, more than half of the substrate is above the liquid level (e.g., from the tank), e.g., 25-40% of the substrate can be submerged in the liquid in the tank or below the position where drying vapor is supplied to the substrate. Similarly, in the second position 202b, the substrate 205 can be entirely above the drier 211, or still partially in the drier.

The first robot arm 202 could be provided by the cleaner robot arm, i.e., the same robot arm that lowers the substrate 205 into the tank 201. Alternatively, if the support 204 is vertically movable, the first robot arm 202 could be provided by the support 204, i.e., the support 204 lifts the substrate 205 out of the tank 201. As yet another alternative, the substrate 205 could be lowered onto a support 204 (shown in phantom in FIG. 2), e.g., a stationary support, in the tank 201, e.g., by the cleaner robot arm, and then a separate robot arm can be used to lift the substrate 205 off the support 204 and out of the tank 201. For example, the first robot arm 202 can be a pusher pin that pushes the substrate from the bottom partially out of the tank 201. Alternatively, the first robot arm 202 can include a notched body to hold and lift from a point at a bottom edge of the substrate, and a two-finger gripper to hold a top edge of the substrate in place.

In the second position 202b, the substrate 205 is transferred from the first robot arm 202 to a second robot arm 221, e.g., an output station arm. For example, the second robot arm 221 may pick up the substrate 205 from the first robot arm 202 in a substantially vertical orientation, e.g., up to 15° off vertical axis. While the second robot arm 221 is holding the substrate 205, the first robot arm 202 can be reinserted into the tank or lowered within the tank back to the first position 202a.

If the substrate at the hand-off position, i.e., the second position 202b, is not completely out of the tank 201 and drier 211, then the second robot arm 221 can lift the substrate 205 substantially vertically (shown by arrow 250) until the substrate 205 has cleared the tank 201 and drier 211. From a position in which the substrate 205 has cleared the tank 201 and drier 211, the second robot arm 221 tilts the substrate 205 from a substantially vertical orientation 221a, e.g., up to 15° off vertical axis, to a substantially horizontal orientation 221b, e.g., up to 15° off horizontal axis, as shown by the arrow 222, and places the substrate 205 onto a rotatable pedestal 232 of an aligner stage 231. The substrate 205 is rested on the rotatable pedestal 232 of the aligner stage 231 in a third position 202c, as shown in FIG. 2. The substrate 205 can be coupled to the rotatable pedestal 232 by vacuum suction that can hold the substrate 205 in place during rotation of the pedestal 232. Alternatively, the substrate 205 can be rotated by a substrate edge gripper, or a roller, that can hold the substrate 205 and rotate it to a desired orientation.

The second robot arm 221 can include a notched body to hold and lift from a point at the top edge of the substrate (e.g., at a point between the two fingers of the gripper of the first robot arm 202, and a two-finger gripper to hold a bottom edge of the substrate (e.g., on opposite sides of the notched body of the first robot arm 202). For example, once the substrate 205 is lifted out of the tank 201, the second robot arm 221 grips the substrate 205, the first robot arm 202 releases the substrate 205 and retracts, and then the second robot arm 221 moves the wafer to horizontal orientation.

In some implementations, rather than a separate first robot and second robot, a single robot arm serves both to lift the substrate 205 from the first position 202a in the tank 201 to the second position 202b out of the tank 201 and above the drier 211, and then rotate the substrate 205 from the second position 202b to the substantially horizontal third position 202c over the aligner stage 231.

The rotatable pedestal 232 rotates as shown by the arrow 233 while an alignment sensor 234 detects the orientation of the substrate 205. The controller 140 may be used to specify a desired orientation of the substrate 205. Once the alignment process is complete, i.e., the substrate has been rotated to the desired orientation, a factory interface robot 112 picks up the substrate 205 in a substantially horizontal orientation from the rotatable pedestal 232 and transports the substrate 205 out from the drying station 134. The movement of the factory interface robot 112 is shown by the arrow 242. In this way, the alignment system can be integrated as part of the post-CMP drying process as part of the handoff to the factory interface robot. The process of simultaneous drying and alignment of multiple substrates is described in more detail below with reference to FIGS. 4A-4E.

Figure 4C:
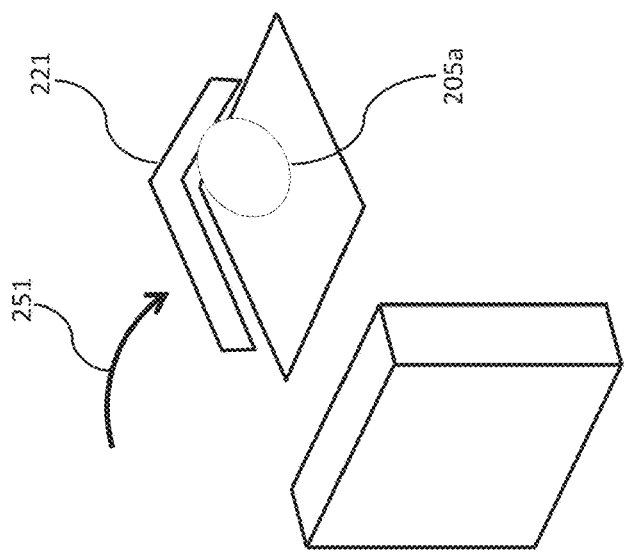
FIG. 4A-4E are schematic perspective views showing operation of a drying system to simultaneously treat one substrate and align another substrate.
Figure 4B:
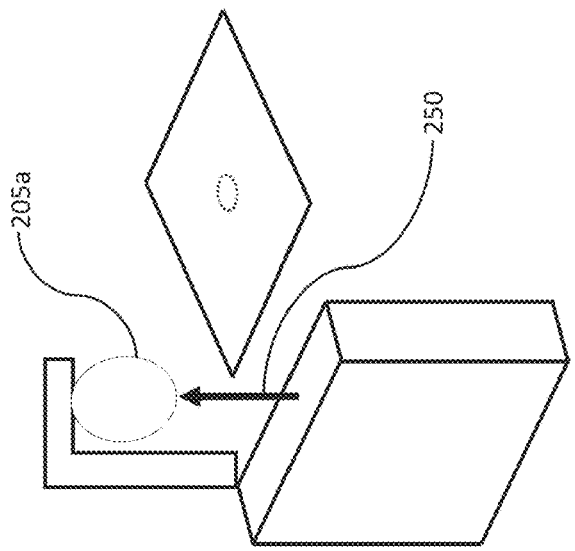
Figure 4A:
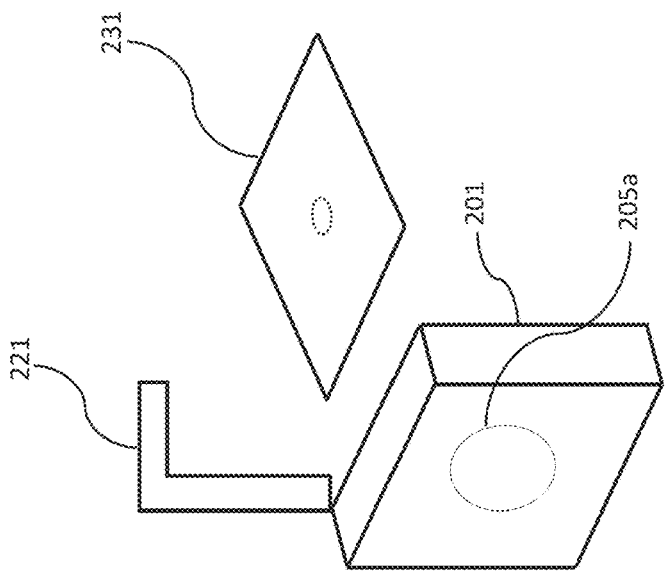
Figure 4E:
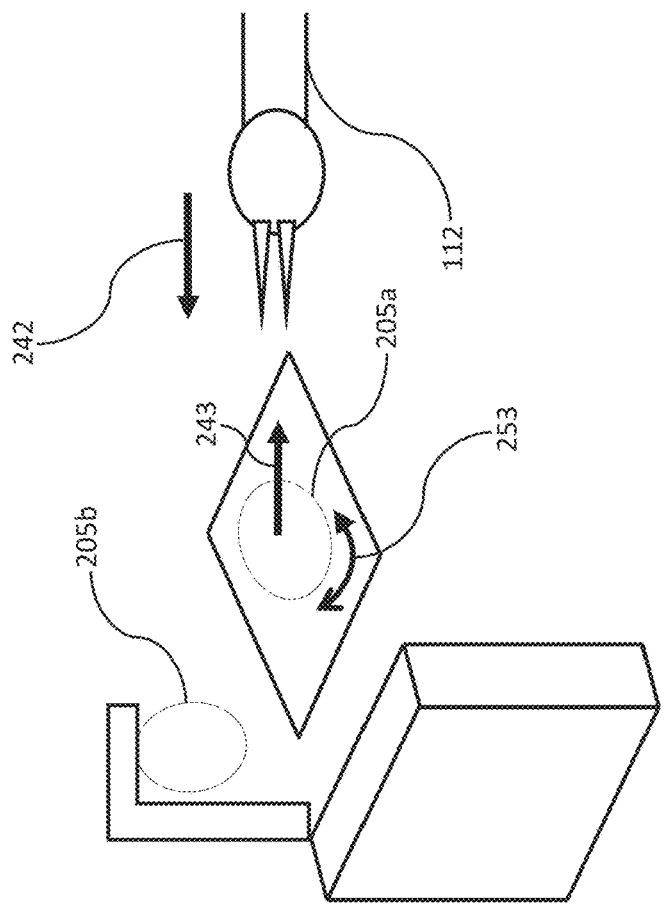

FIG. 4A illustrates a second robot arm 221 (e.g., an output station arm) in a substantially vertical orientation, e.g., up to 15° off vertical axis, an aligner stage 231, and a drier 201 processing a first substrate 205a. Since the first substrate 205a is positioned in a substantially vertical orientation (e.g., up to 15° off vertical axis) in the drier 201, the drying of the first substrate 205a is referred to as a vertical drying process. As illustrated in FIG. 4B, once the drying is complete, the first robot arm 202 moves the first substrate 205a vertically partially or entirely out of the tank 201 and drier 211, and the substrate is picked up by the second robot arm 221, in a manner as described above with reference to FIG. 2. Next, if necessary, the second robot arm 221 completes lifting of the substrate out of the tank 201 and drier 211. Then the second robot arm 221 tilts from a substantially vertical orientation to a substantially horizontal orientation, e.g., up to 15° off horizontal axis (as shown by the arrow 251) and places the first substrate 205a onto the aligner stage 231, as illustrated in FIG. 4C. At the same time, a second substrate 205b (shown in FIG. 4D) can enter the drier 201, in a manner as described above with reference to FIG. 2.

Figure 4D:
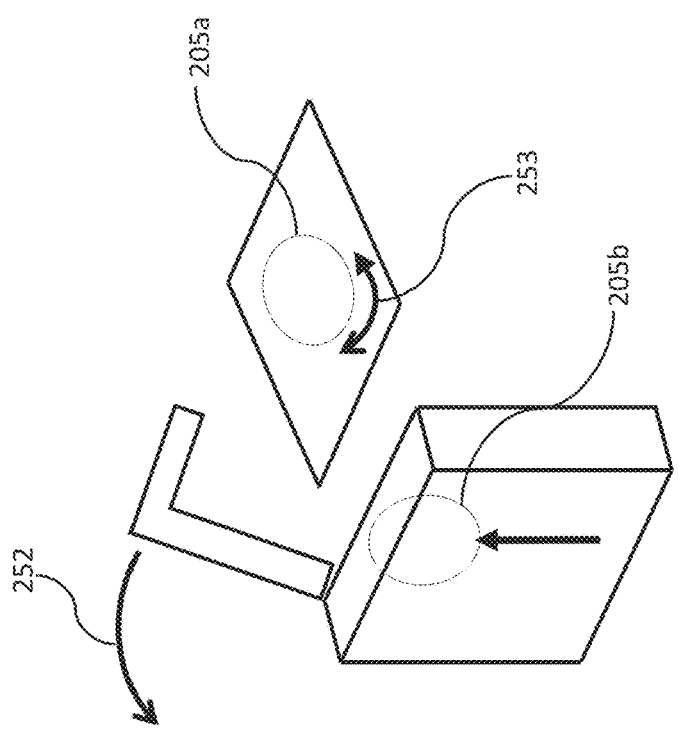

Referring now to FIG. 4D, the aligner stage 231 rotates the first substrate 205a, as illustrated by the arrow 253, to a desired orientation. The aligner stage 231 can rotate the substrate 205a clockwise or anticlockwise. The rotation can be about an axis perpendicular to the surface of the substrate, and the axis can pass through the center of the substrate. At the same time, the second robot arm 221 tilts back from the horizontal orientation to the vertical orientation (e.g., 15° off vertical axis), as illustrated by the arrow 252, while the second substrate 205b is being processed in the drier 201. Next, referring to FIG. 4E, once the alignment process of the first substrate 205a is complete, a factory interface robot 112 moves towards the aligner stage 231 as shown by the arrow 242, picks up the first substrate 205a from the aligner stage 231 in a substantially horizontal orientation, and moves it out of the drying station in a direction as shown by the arrow 243. At the same time, the second substrate 205b moves vertically out of the drier 201 and interfaces with the second robot arm 221, in a manner as described above with reference to FIG. 2.

In this way, multiple substrates can be simultaneously dried and aligned in one drying station resulting in a significant increase in throughput and decreased processing time. Since the drier 201 doesn't need to wait for the factory interface robot to retrieve the first substrate 205a before starting to process the second substrate 205b, the drier productivity may be increased by as much as 18%. Additionally, the number of moves required to be performed by the factory interface robot 112 per substrate alignment may be decreased such that the factory interface robot 112 is able to maintain its steady state cycle and increase productivity.

In another implementation, the aligner stage 231 may be replaced with a static station for wafer output, such that the substrate 205*a* is picked up directly by the factory interface robot 112 from the static station and moved out for further processing without alignment. With this implementation, the factory interface robot 112 is still decoupled from the drying station critical path, allowing for the same advantages as described above with reference to FIGS. 4A-4E, such as a significant increase in throughput and decrease in processing time.

The controller and other computing devices part of systems described herein can be implemented in digital electronic circuitry, or in computer software, firmware, or hardware. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments of the subject matter have been described. Other embodiments are within the scope of the following claims.

What is claimed is:

1. A substrate cleaning and drying system, comprising:
    a cleaning station including a first support to hold a substrate in a substantially vertical orientation;
    a drying station positioned adjacent the cleaning station, the drying station including a tank to contain a liquid, a second support to hold the substrate in a substantially vertical orientation in the liquid, and a dispenser to deliver drying fluid comprising a surfactant;
    a cleaner robot having an arm configured to transfer the substrate from the cleaning station to the drying station;
    an aligner stage arranged on a side of the drying station opposing the cleaning station, the aligner stage including a rotatable support to hold the substrate in a horizontal orientation and to rotate the substrate about an axis perpendicular to the substrate to a desired orientation;
    a transfer robot having a robot arm arranged between the drying station and the aligner stage rotatable between a substantially vertical first position for receiving the substrate from above the drying station and a substantially horizontal second position above the aligner stage and for releasing the substrate onto the aligner stage, the robot arm having a first end to hold the substrate and a second end that is rotatable around a horizontal axis parallel to a face of the substrate and offset from the substrate such that the substrate swings face-first from a substantially vertical orientation over the drying station to a substantially horizontal orientation over the aligner stage;
    a factory interface module to support a cassette; and
    a factory interface robot to transfer the substrate from the aligner stage into the factory interface module while in a horizontal orientation.

2. The system of claim 1, wherein the arm of the cleaner robot is configured to lower the substrate into the tank.

3. The system of claim 2, comprising a first robot configured to raise the substrate out of the tank to a position for a hand-off to the robot arm.

4. The system of claim 2, wherein the robot arm is configured to raise the substrate out of the tank to the first position.

5. The system of claim 2, wherein the arm of the cleaner robot is configured to lower the substrate onto the second support.

6. The system of claim 1, comprising a first robot configured to receive the substrate in a hand-off from the cleaner robot above the tank and lower the substrate into the tank.

7. The system of claim 6, wherein the first robot is configured to raise the substrate out of the tank to the first position.

8. The system of claim 6, wherein the first robot is configured to be reinserted into or lowered within the tank while the robot arm holds the substrate.

9. The system of claim 6, wherein the first robot is configured to lower the substrate onto the second support.

10. The system of claim 6, wherein the aligner stage is configured to align a first substrate of multiple substrates simultaneously with the drying station drying a second substrate of the multiple substrates.

11. The system of claim 1, wherein the robot arm includes fingers adjustable to grip edges of the substrate during rotation between the first position and the second position.

12. The system of claim 1, wherein the rotatable support comprises a pedestal rotatable about a vertical axis and coupleable to the face of the substrate on the aligner stage.

* * * * *